US006677821B2

(12) United States Patent
Kusunoki et al.

(10) Patent No.: US 6,677,821 B2
(45) Date of Patent: Jan. 13, 2004

(54) DISTORTION COMPENSATING APPARATUS

(75) Inventors: Shigeo Kusunoki, Kanagawa (JP);
Katsuya Yamamoto, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/030,292

(22) PCT Filed: Apr. 20, 2001

(86) PCT No.: PCT/JP01/03411
§ 371 (c)(1),
(2), (4) Date: May 28, 2002

(87) PCT Pub. No.: WO01/82473
PCT Pub. Date: Nov. 1, 2001

(65) Prior Publication Data
US 2002/0153950 A1 Oct. 24, 2002

(30) Foreign Application Priority Data
Apr. 21, 2001 (JP) ........................................ 2000-121338

(51) Int. Cl.$^7$ ................................................ H03F 1/26
(52) U.S. Cl. .................... 330/149; 330/136; 330/107
(58) Field of Search .................... 330/107, 136, 330/149

(56) References Cited
U.S. PATENT DOCUMENTS
6,112,062 A * 8/2000 Hans et al. .................. 330/149

FOREIGN PATENT DOCUMENTS
JP 03-198407 A * 8/1991

OTHER PUBLICATIONS
Lohita et al., "An Adaptive Digital Technique for compensating for analog quadrature modulator Idemodulator impairment" IEEE Pacific Rim Conference on Computers and Signal Processing vol. 2, May 19–21, 1993 pp. 447–450.*

* cited by examiner

Primary Examiner—Michael B Shingleton
(74) Attorney, Agent, or Firm—Jay H. Maioli

(57) ABSTRACT

A circuit that compensates for distortion of an output signal of a power amplifying circuit of a transmitting section of a base station or a terminal of a radio communication system and apparatus such as a mobile phone, and a predistorter system applicable to radio communication systems and that does not depend on a use system other than generation of envelope change due to a high-frequency input signal without addition of the distortion compensating circuit to a base band portion, the compensating circuit including a memory device where inverted distortion data of a high-frequency power amplifying device for a mobile phone are stored is driven with data obtained by detecting an envelope of a high-frequency input signal having envelope change as an address and distortion compensation of the power amplifying device is made by adjusting a variable gain device provided at a prestage of the power amplifying device.

4 Claims, 10 Drawing Sheets

DISTORTION COMPENSATING APPARATUS

TECHNICAL FIELD

The present invention relates to a power amplifying circuit to be used for a transmitting section of a base station or a terminal station of a radio communication system and a radio communication apparatus such as a mobile phone, and more particularly, to a distortion compensating device which compensates for non-linear distortion of an output signal of the power amplifying circuit.

BACKGROUND ART

In a transmission high-frequency power amplifying circuit (hereinafter referred to as power amplifying circuit) of a mobile phone or the like, if it is intended to increase power availability, non-linearity is intensified so that a distortion is generated in the output signal. As a distortion compensating device for compensating such a distortion, predistortion technology employing a compensating means having a characteristic inverse to the distortion of the power amplifying circuit has been well known.

Prior to description of the above described predistortion technology, principle about compensation of amplitude distortion will be described. The high-frequency signal which is an input signal to be considered now is a signal for use in the mobile phone, which is an orthogonal phase modulation signal such as $\pi/4$ shift QPSK (Quad Phase Shift Keying), 0-degree QPSK and the like subject to a band restriction. These signals can be expressed by a waveform obtained by amplitude-modulating high-frequency carrier components with envelope components changing slowly with the passage of time. This is expressed in an equation (1).

$$V = Vi(t) \cdot \cos(\omega t) \quad (1)$$

where V is a general expression of high-frequency signal voltage, Vi is the aforementioned envelope component, $\omega$ is an angular frequency of the high-frequency component. The signal expressed by the equation (1) is subjected to distortion when it is amplified by the power amplifying circuit 12 (see FIG. 11).

Although in the general power amplifying circuit 12, as shown in FIG. 4, the output power increases as the input power increases, its amplification factor decreases gradually. That is, gain suppression is generated, so that distortion is generated by this characteristic. When in an amplitude characteristic curve 21 of FIG. 4, the input power is a value indicated by A in FIG. 4, the output power is a value indicated by B. In this case, if the amplitude characteristic 22 of the power amplifying circuit 12 is linear, its output power must become B'. Then, if the input power A' is used instead of the input power A, its output power is B', so that by providing the input voltage with the non-linear distortion preliminarily, no distortion is generated in the output power. By converting input voltage A to input voltage A' like this, the distortion becomes to be improved.

The technology of predistortion is an art for having the base band portion carry out an operation for converting this input voltage A to input voltage A'. Here, it should be noted that converting the input power A having no distortion originally to the input power A' leads to adding the distortion to the input power A. This added distortion is killed by a distortion generated in the power amplifying circuit 12, so that it is considered that the distortion is improved. This added distortion acts like an inverted distortion with respect to a distortion generated in the power amplifying circuit 12.

FIG. 11 shows a block diagram about a typical predistortion well known since before. FIG. 11 will be described simply. FIG. 11 shows a transmitting portion of a mobile phone. Analog in-phase component I and orthogonal component Q generated in a signal processing portion 30 are digitalized by I and Q analog-digital converters (ADC) 31, 32 and then, the aforementioned operation for converting the input power A to the input power A' is carried out by I- and Q-signal predistorters 33, 34. After that, the signals are converted to analog signals by I- and Q-signal digital-analog converters (DAC) 35, 36 and modulated by an orthogonal transformer 37. Then, it is converted to a high-frequency signal by an up-converter 38, amplified by a power amplifying circuit 12 and transmitted. If the predistortion is not carried out, the aforementioned ADCs 31, 32, the predistorters 33, 34 and the DACs 35, 36 in the base band portion 39 in the block shown in FIG. 11 are not necessary. That is, the predistortion conducts a signal conversion operation with respect to the original I, Q signals.

If the aforementioned predistortion is carried out, a signal provided with the inverted distortion component is outputted from the base band portion 39. However, in a general mobile phone, it is indispensable to provide a filter for removing digital noise contained in the base band output and a band-pass filter may be provided for an intermediate frequency portion also depending on the case. These filters cannot be removed in consideration of the purpose for which they are installed. It turns out that the inverted distortion component is removed together with the digital noise by this filter. As a result, the distortion in the power amplifying circuit 12 is not killed, so that the distortion compensation is not carried out.

DISCLOSURE OF THE INVENTION

A first distortion compensating device of the present invention is a distortion compensating device for carrying out predistortion with respect to a power amplifying means 12 whose distortion should be compensated, comprising: an envelope detecting means 1 to which a high-frequency signal $S_1$ generating an envelope change is supplied for detecting an envelope signal of the high-frequency signal $S_1$; an amplitude correction memory means 3 for storing an inverted distortion amplitude value of a distortion generated in the power amplifying means 12 with digital data $S_3$ obtained by digitalizing the envelope signal $S_2$ of the envelope detecting means 1 as an address; and a gain variable means 10 disposed in a prestage of the power amplifying means 12 to which the high-frequency signal $S_1$ generating the envelope change is supplied, capable of controlling a passage gain of the high-frequency signal, characterized in that the inverted distortion data of the amplitude correction memory means 3 is converted to analog data and supplied to the gain variable means 10 so as to compensate a distortion of the amplitude of a gain of the power amplifying means 12.

A second distortion compensating device of the present invention is a distortion compensating device for carrying out predistortion on a power amplifying means 12 whose distortion should be compensated, comprising: an envelope detecting means 1 to which a high-frequency signal $S_1$ generating an envelope change is supplied for detecting an envelope signal $S_2$ of the high-frequency signal $S_1$; a phase correction memory means 6 for storing an inverted distortion phase value of a distortion generated in the power amplifying means 12 with digital data $S_3$ obtained by digitalizing the envelope signal $S_2$ of the envelope detecting means 1 as an address; and a phase-shifting means 11 disposed in a prestage of the power amplifying means 12 to which the high-frequency signal $S_1$ generating the envelope change is supplied, capable of controlling a passage phase of the high-frequency signal, characterized in that the inverted distortion data of the phase correction memory means 6 is converted to analog data and supplied to the phase-shifting means 11 so as to compensate a distortion of the phase of the power amplifying means 12.

A third distortion compensating device of the present invention is a distortion compensating device according to the first invention, further including; a phase correction memory means 6, parallel located with the amplitude correction memory means 3, which stores an inverted distortion phase value of distortion to be generated in the power amplifying means 12, with digital data $S_3$ obtained by digitalizing the envelope signal $S_2$ of the envelope detecting means 1 as an address; and a phase-shifting means 11 which can control passage phase of the high frequency signal by supplying analog data that the inverted distortion data of this phase correction memory means 6 is converted into an analog data, characterized in that the phase-shifting means 11 is connected with the gain variable means 10 in series at the prestage of the power amplifying means 12.

A fourth distortion compensating device of the present invention is a distortion compensating device according to the first or third invention characterized in that a delay means 9 for adjusting a difference of delay time between a main path having the power amplifying means 12 and the gain variable means 10 and a corrective control signal route having the envelope detecting means 1 for supplying a control signal to the gain variable means 10 and an amplitude correction memory means 3 is provided in the main path.

A fifth distortion compensating device of the present invention is a distortion compensating device according to the second or third invention characterized in that a delay means 9 for adjusting a difference of delay time between a main path having the power amplifying means 12 and the phase-shifting means 11 and a corrective control signal route having the envelope detecting means 1 for supplying a control signal to the phase-shifting means 11 and the phase correction memory means 6 is provided in the main path.

A sixth distortion compensating device of the present invention is a distortion compensating device according to the fourth or fifth invention characterized in that by detecting an envelope signal $S_{14}$ from an output side of the power amplifying means 12 and feeding back a differential signal obtained by comparing this envelope signal $S_{14}$ with an output of the envelope signal $S_2$ from the envelope detecting means 1 to the delay means 9, the delay time is controlled.

A seventh distortion compensating device of the present invention is a distortion compensating device according to the first invention characterized in that an output obtained by comparing an output signal $S_{14}$ as a result of envelope-detecting output of the power amplifying means 12 with an envelope signal $S_2$ of the envelope detecting means 1 is digitalized. With this digital data serving as an address, a correction data memory means 17 for storing correction data for correcting a characteristic change by temperature is driven so as to multiply an output of the correction data memory means 17 by an output of the amplitude correction memory means 3, thereby compensating a change of the temperature characteristic of the power amplifying means 12.

An eighth distortion compensating device of the present invention is a distortion compensating device for carrying out predistortion on a power amplifying means 12 whose distortion should be compensated, comprising: an envelope detecting means 1 to which a high-frequency signal $S_1$ generating an envelope change is supplied for detecting an envelope signal of a high-frequency signal $S_1$; a phase correction memory means 6 for storing an inverted distortion phase value of a distortion generated in the power amplifying means 12 with digital data $S_3$ obtained by digitalizing an envelope signal $S_2$ of the envelope detecting means 1 as an address; and a phase-shifting means 11 disposed in a poststage of the power amplifying means 12 to which the high-frequency signal $S_1$ generating the envelope change is supplied, capable of controlling a passage phase of the high-frequency signal $S_1$, characterized in that inverted distortion data of the phase correction memory means 6 is converted to analog data and supplied to the phase-shifting means 11 so as to compensate a distortion of the phase of the power amplifying means 12.

A ninth distortion compensating device of the present invention is a distortion compensating device according to the eighth invention, further including: an amplitude correction memory means 3, parallel located with the phase correction memory means 6, which stores an inverted distortion amplitude value of distortion to be generated in the power amplifying means 12, with digital data $S_3$ obtained by digitalizing the envelope signal of the envelope detecting means 1 as an address; and a gain variable means 10 which can control passage gain of the high frequency signal by supplying analog data that the inverted distortion data of this amplitude correction memory means 3 is converted into analog data, characterized in that the gain variable means 10 is connected at the prestage of the power amplifying means 12.

An eleventh distortion compensating device of the present invention is a distortion compensating device according to the tenth invention characterized in that by detecting an envelope signal $S_2$ from an output side of the power amplifying means 12 and feeding back a differential signal obtained by comparing this envelope signal $S_{12}$ with an envelope signal output $S_2$ from the envelope detecting means 1 to the delay means 9, the delay time is controlled.

A twelfth distortion compensating device of the present invention is a distortion compensating device comprising: a first envelope detecting means 1 for detecting an envelope signal $S_2$ with a part of a high frequency signal $S_1$ having fluctuation of envelope as an input; a digital-to-analog converting means 2 for converting the envelope signal $S_2$ of this first envelope detecting means 1 into digital data $S_3$; an amplitude correction memory means 3 in which digital data $S_3$ is inputted as an address and which outputs amplitude correction data $S_4$ corresponding to the address by means of data stored for amplitude correction in advance; a first low pass filtering means 5 for converting amplitude correction data $S_4$ into an analog signal to eliminate digital noise of an analog signal $S_5$; a phase correction memory means 6 in which digital data $S_3$ is inputted as an address and which outputs phase correction data $S_6$ corresponding to the address by means of data stored for phase correction in advance; a second low pass filtering means 8 for converting phase correction data $S_6$ into an analog signal to eliminate digital noise of an analog signal $S_7$; a delay means 9 which can adjust the volume of delay of passing time by means of a control signal $S_{16}$ to be added into a control terminal $T_{C1}$ with the high frequency signal $S_1$ as an input; a gain variable means 10 for varying a passage gain depending on the voltage of a signal $S_8$ from the first low pass filtering means 5, to be added into a control terminal $T_{C2}$ with a delay signal $S_{10}$ of the delay means 9 as an input; a phase-shifting means 11 for varying a passage phase by an output signal $S_9$ from the second low pass filtering means 8 with an output $S_{11}$ of this gain variable means 10 as an input; to input a variable output signal into a power amplifying means 12 whose distortion should be compensated; a second envelope detecting means 13 for detecting an envelope signal $S_{13}$ of an output of the power amplifying means 12 whose distortion should be compensated; a subtracting means 14 for detecting a difference between the envelope signal $S_2$ and an envelope signal $S_{14}$ with envelope signals $S_2$ and $S_{14}$ of the first and the second envelope detecting means 1, 13 as inputs; and a third low pass filtering means 15 for detecting only a DC signal $S_{16}$ of this subtracting means 14, characterized in that the DC signal $S_{16}$ of this third low pass filtering means 15 is fed back to the control terminal $T_{C1}$ of the delay means 9.

A thirteenth distortion compensating device of the present invention is a distortion compensating device comprising: a first envelope detecting means 1 for detecting an envelope signal $S_1$ with a part of a high frequency signal $S_1$ having fluctuation of envelope as an input; a digital-to-analog converting means 2 for converting an envelope signal $S_2$ of this first envelope detecting means 1 into digital data $S_3$; an amplitude correction memory means 3 in which digital data $S_3$ is inputted as an address and which outputs amplitude correction data $S_4$ corresponding to the address by means of data stored for amplitude correction in advance; a first low pass filtering means 5 for converting amplitude correction data $S_4$ into an analog signal to eliminate digital noise of an analog signal $S_5$; a phase correction memory means 6 in which digital data $S_3$ is inputted as an address and which outputs phase correction data corresponding to the address by means of data stored for phase correction in advance; a second low pass filtering means 8 for converting phase correction data into an analog signal $S_7$ to eliminate digital noise of the analog signal $S_7$; a delay means 9 which can adjust the volume of delay of passing time by means of a control signal to be added into a control terminal $T_{C1}$ with the high frequency signal $S_1$ as an input; a gain variable means 10 for varying a passage gain depending on the voltage of a signal $S_8$ from the first low pass filtering means 5, to be added into a control terminal $T_{C2}$ with a delay signal $S_{10}$ of this delay means 9 as an input; a phase-shifting means 11 for varying a passage phase by means of an output signal $S_9$ from the second low pass filtering means 8 by inputting an output $S_{11}$ of this gain variable means 10 into a power amplifying means 12 whose distortion should be compensated and inputting an output $S_{13}$ of the power amplifying means 12 thereinto; a second envelope detecting means 13 for detecting an envelope signal $S_{14}$ of an output of this phase-shifting means 11; a subtracting means 14 for detecting a difference between the envelope signal $S_2$ and the envelope signal $S_{14}$ with envelope signals $S_2$ and $S_{14}$ of the first and the second envelope detecting means 1,13 as inputs; and a third low pass filtering means 15 for detecting only a DC signal $S_{15}$ of this subtracting means 14, characterized in that the DC signal $S_{11}$ of this third low pass filtering means 15 is fed back to the control terminal $T_{C1}$ of the delay means 9.

A fourteenth distortion compensating device of the present invention is a distortion compensating device comprising: a first envelope detecting means 1 for detecting an envelope signal $S_1$ with a part of a high frequency signal $S_1$ having fluctuation of envelope as an input; a digital-to-analog converting means 2 for converting an envelope signal $S_2$ of this first envelope detecting means 1 into digital data $S_3$; an amplitude correction memory means 3 in which digital data $S_3$ is inputted as an address and which outputs amplitude correction data corresponding to the address by means of data stored for amplitude correction in advance; a multiplying means 18 in which digital multiplier is the product with a digital output $S_4$ of the amplitude correction memory means 3 as multiplicand; a first low pass filtering means 5 for converting digital data $S_{19}$ of this multiplying means 18 to an analog signal $S_5$ to eliminate digital noise of the analog signal $S_5$; a phase correction memory means 6 in which digital data $S_3$ is inputted as an address and which outputs phase correction data corresponding to the address by means of data stored for phase correction in advance; a second low pass filtering means 8 for converting phase correction data $S_6$ into an analog signal $S_7$ to eliminate digital noise of the analog signal $S_7$; a delay means 9 which can adjust the volume of delay of passing time by means of a control signal $S_{16}$ to be added into a control terminal $T_{C1}$ with the high frequency signal $S_1$ as an input; a gain variable means 10 for varying a passage gain depending on the voltage of a signal $S_8$ from the first low pass filtering means 5, to be added into a control terminal $T_{C2}$ with a delay signal $S_{10}$ of the delay means 9 as an input; a phase-shifting means 11 for varying a passage phase by an output signal $S_9$ from the second low pass filtering means 8 with an output of the gain variable means 10 as an input to input a variable output signal into a power amplifying means 12 whose distortion should be corrected; a second envelope detecting means 13 for detecting an envelope signal of an output of the power amplifying means 12 whose distortion should be corrected; a subtracting means 14 for detecting a difference between the envelope signal $S_2$ and an envelope signal $S_{14}$ with the envelope signals $S_2$ and $S_{14}$ of the first and second envelope detecting means 1, 13 as inputs; a third low pass filtering means 15 for detecting only a DC signal of this subtracting means 14 to feed it back to the control terminal $T_{C1}$ of the delay means 9; and a correction data memory means 17 for outputting data corresponded to the address, which corrects a change of characteristic due to temperature with the output of digital data $S_{17}$ in which an output difference signal $S_{15}$ of the subtracting means 14 is digitalized as an address, characterized in that data corresponding to the address from this correction data memory means 17 is supplied as multiplier of the multiplying means 18.

In accordance with the first-twelfth distortion compensating device of the present invention, a device having an extremely great effect in which predistortion due to digital is carried out without connection of the signal with other than the main path adjacent to the power amplifying circuit and the device does not depend on a mobile phone system is obtained.

BEST MODE FOR CARRYING OUT THE INVENTION

Figure 1:
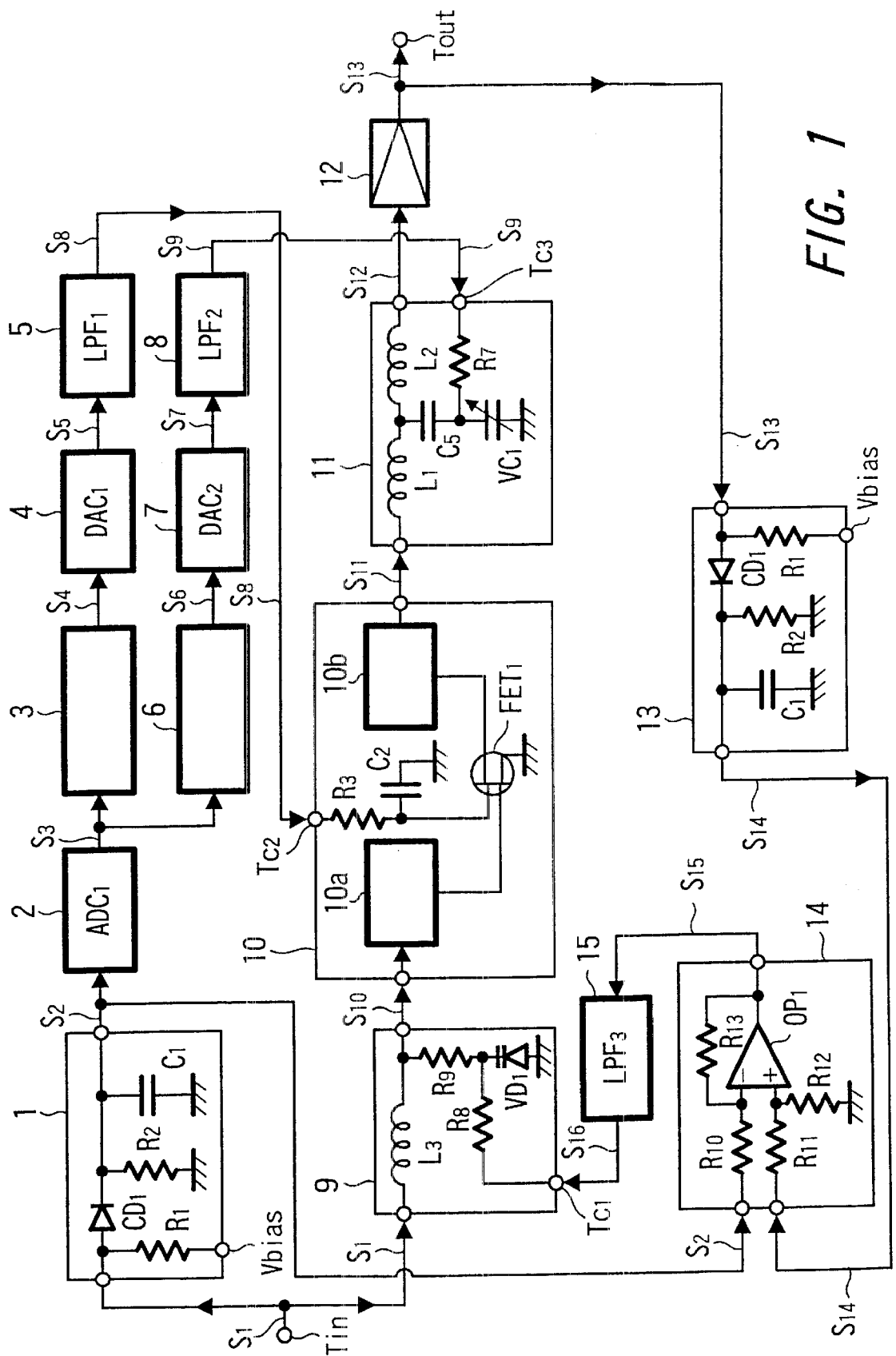
FIG. 1 is a block diagram showing an embodiment of the present invention.

The present invention will be described in detail with reference to the accompanying drawings. FIG. 1 is a block diagram showing an embodiment of the present invention. First, the structure of the circuit will be described.

Referring to FIG. 1, the amplitude compensating path comprises a first envelope detecting circuit 1 for detecting an envelope signal $S_2$ with a high-frequency signal $S_1$ having changes of the envelope, an analog/digital converter ($ADC_1$) 2 for digitalizing this analog-like envelope signal $S_2$ to output a digital signal $S_3$, a first amplitude compensating memory 3 which receives an input of the digital signal $S_3$ as an address so as to output corresponding-to-address amplitude correction data $S_4$ stored preliminarily for distortion amplitude correction for a power amplifying circuit 12, a first digital/analog converter ($DAC_1$) 4 for converting this amplitude correction data $S_4$ to analog signal $S_5$ and a first low pass filter ($LPF_1$) 5 for removing digital noise of this analog signal $S_5$.

Further, a phase correction circuit comprises a second phase correction memory 6 for when the digital signal $S_3$ from the $ADC_1$·2 is employed as an address, outputting a distortion phase correction data $S_6$ of the power amplifying circuit 12 corresponding to this address, a second digital/analog converter ($DAC_2$) 7 for converting this phase correction data $S_6$ to analog signal $S_7$ and a second low pass filter ($LPF_2$) 8 for removing digital noise from this analog signal $S_7$.

Next, as a main path, a delay circuit 9 which receives an input of high-frequency signal $S_1$ for adjusting a delay amount of passage time with a signal $S_{16}$ applied to a control terminal $Tc_1$, a gain variable circuit 10 which receives an output $S_{10}$ of this delay circuit 9 for changing a passage gain depending on the voltage of the signal $S_8$ applied to a control terminal $Tc_2$ and a phase-shift circuit 11 which receives an output $S_{11}$ of this gain variable circuit 10 for changing its passage phase with the signal $S_9$ applied to a control terminal $Tc_3$.

An output $S_{12}$ of this phase-shift circuit 11 is inputted to the power amplifying circuit 12 for compensating the distortion, the output $S_8$ of the first $LPF_1$·5 is inputted to the control terminal $Tc_2$ of the gain variable circuit 10 and the output $S_9$ of the second $LPF_2$·8 is inputted to the control terminal $Tc_3$ of the phase-shift circuit 11.

Next, a feedback loop is constructed as a means for generating a signal to be inputted to the control terminal $Tc_1$ of the aforementioned delay circuit 9. This feedback loop comprises a second envelope detecting circuit 13 for detecting an envelope signal $S_{14}$ of an output $S_{13}$ of the power amplifying circuit 12 for compensating a distortion, a subtracting circuit 14 which with an envelope signal $S_{14}$ as an input and part of the output $S_2$ of the first envelope detecting circuit 1 as another input, detects a difference between both as a signal $S_{15}$ and a third low pass filter ($LPF_3$) 15 which detects only a DC component $S_{16}$ out of the signal $S_{15}$ and inputs the DC component $S_{16}$ which is an output of this $LPF_3$ into the control terminal $Tc_1$ of the delay circuit 9.

Next, an operation of the distortion compensating device of the present invention will be described. The distortion compensating device shown in FIG. 1 comprises three signal routes consisting of a main path having the power amplifying circuit 12 for compensation, an amplitude correcting route and a phase correcting route and a feedback loop.

In FIG. 1, a high-frequency signal $S_1$ of an orthogonal phase modulation signal such as π/4 shift QPSK, 0-degree QPSL and the like subjected to a band restriction for use in mobile phones is supplied to an input terminal Tin of the distortion compensating device. This high-frequency signal $S_1$ includes an envelope component obtained by modulating a high frequency carrier with a base band signal component, the envelope component changing slowly with a passage of time.

The high-frequency signal $S_1$ supplied to the input terminal Tin is divided to two parts, which are inputted to the main path of the power amplifying circuit 12 and the auxiliary routes for amplitude and phase. The high-frequency signal $S_1$ inputted to the auxiliary paths detects the envelope signal $S_2$ by means of the first envelope detecting circuit 1.

The envelope signal $S_2$ detected by the first envelope detecting circuit 1 is converted to digital data by the $ADC_1$·2. Data $S_3$ of this digitalized envelope signal is divided to two parts for the amplitude correcting route and phase correcting route. Data $S_3$ inputted to the amplitude correcting route is inputted as an address for the first amplitude correction memory $M_1$. The first amplitude correction memory 3 outputs inverted distortion correction data stored preliminarily for amplitude correction or amplitude correction data $S_4$ corresponding to address. This amplitude correction data $S_4$ is converted to analog signal $S_5$ by the first $DAC_1$·4, and passes the first $LPF_1$·5 to turn to the signal $S_8$, which is inputted to the control terminal $Tc_2$ of the gain variable circuit 10.

The data $S_3$ inputted to the phase correcting route accesses the second phase correction memory $M_6$ having the same structure as the amplitude correcting route and outputs the inverted distortion phase correction data $S_6$ stored in the second phase correction memory 6. This data $S_6$ is converted to the analog signal $S_7$ by the second $DAC_2$·7 and passes the second $LPF_2$·8, which is inputted to the control terminal $Tc_3$ of the phase-shift circuit 11.

Another part of the high-frequency signal $S_1$ is inputted to the main path, in which it passes the delay circuit 9 so that it turns to a delayed signal $S_{10}$. This signal $S_{10}$ is inputted to the gain variable circuit 10, in which its amplitude is corrected so that it turns to a signal $S_{11}$. After that, the signal $S_{11}$ is inputted to the phase-shift circuit 11, in which its phase is corrected so that it turns to a signal $S_{12}$. Then, this is inputted to the power amplifying circuit 12 for correcting the distortion. The envelope signal advancing through the main path and the envelope signal advancing through the auxiliary route need to be equal in terms of time in the gain variable circuit 10 and the phase-shift circuit 11. The delay circuit 9 is used for equalizing the times.

The aforementioned feedback loop is placed for carrying out this time adjustment accurately. That is, an envelope signal $S_{14}$ is detected from part of the envelope signal $S_2$ and part of the output signal $S_{13}$ of the power amplifying circuit 12 by means of a second envelope detecting circuit 13. A differential signal $S_{15}$ between the envelope signals $S_2$ and $S_{14}$ is detected by the subtracting circuit 14. Then, only the DC component signal $S_{16}$ is detected from the differential signal $S_{15}$ by means of the third $LPF_3$·15. Then, this DC component signal $S_{16}$ is inputted to the control terminal $Tc_1$ of the delay circuit 9 and the delay amount is controlled by the differential signal $S_{16}$ so that a difference between passage time in the auxiliary route and that in the main path is always kept constant.

Next, amplitude correction data stored in the first amplitude correction memory 3 will be described in detail. First, the envelope voltage of the high-frequency signal $S_1$ is assumed to be Vi(t) from the equation (1). Further, the envelope voltage of the output signal $S_{11}$ of the gain variable circuit 10 is assumed to be Vpd(t) and the voltage of the control signal $S_8$ applied to the control terminal $Tc_2$ of this gain variable circuit 10 is assumed to be Vc(t). The voltage stored in the first amplitude correction memory 3 is this Vc(t).

Now, assuming that the gain G (vc) of the gain variable circuit 10 is expressed as follows with the conversion coefficient being a, $$G(vc)=1+a \cdot Vc(t) \quad (2),$$

$$Vpd(t)=Vi(t) \cdot G(vc) \quad (3) \text{ is provided.}$$

So, the equation (3) is substituted for the equation (2). As a result, $Vpd(t)=Vi(t) \cdot \{1+a \cdot Vc(t)\}$ is presented.

$$\text{Then, } Vc(t)=(1/a) \cdot \{Vpd(t)/Vi(t)-d\} \quad (4)$$

Figure 4:
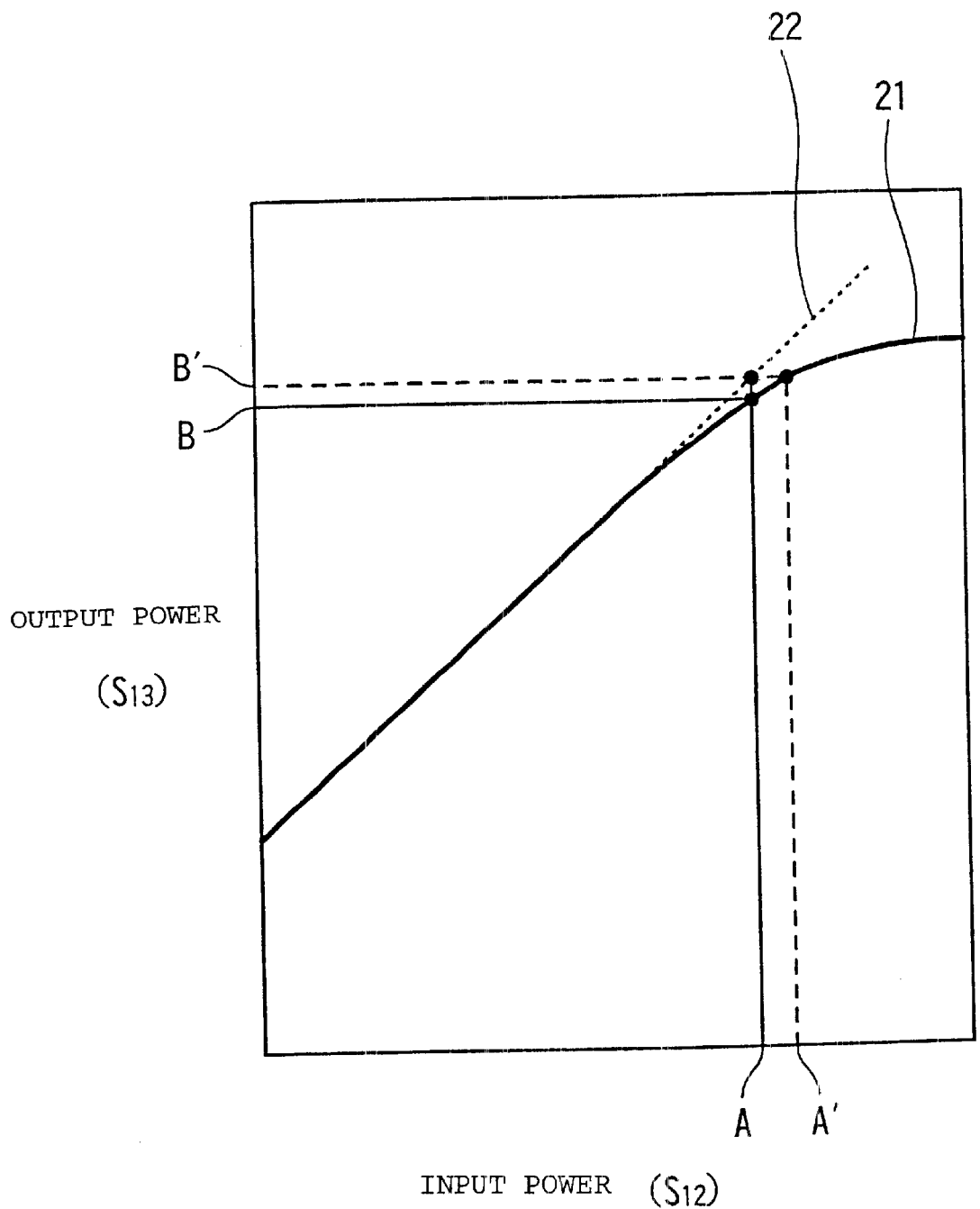
FIG. 4 is a characteristic diagram of amplitude/amplitude (AM/AM) of a power amplifying circuit.

The envelope voltage Vpd(t) can be obtained by measuring an input/output characteristic of the power amplifying circuit 12 whose distortion should be corrected, by exchanging A of the amplitude characteristic curve 21 under the conventional structure in which the predistortion is described in detail in FIG. 4, with A' of an idealized amplitude characteristic 22 so as to provide the A with distortion. Thus, a result obtained by calculating the aforementioned equation (4) with the envelope voltage Vpd(t) is preliminarily stored in the first amplitude correction memory 3.

Figure 5:
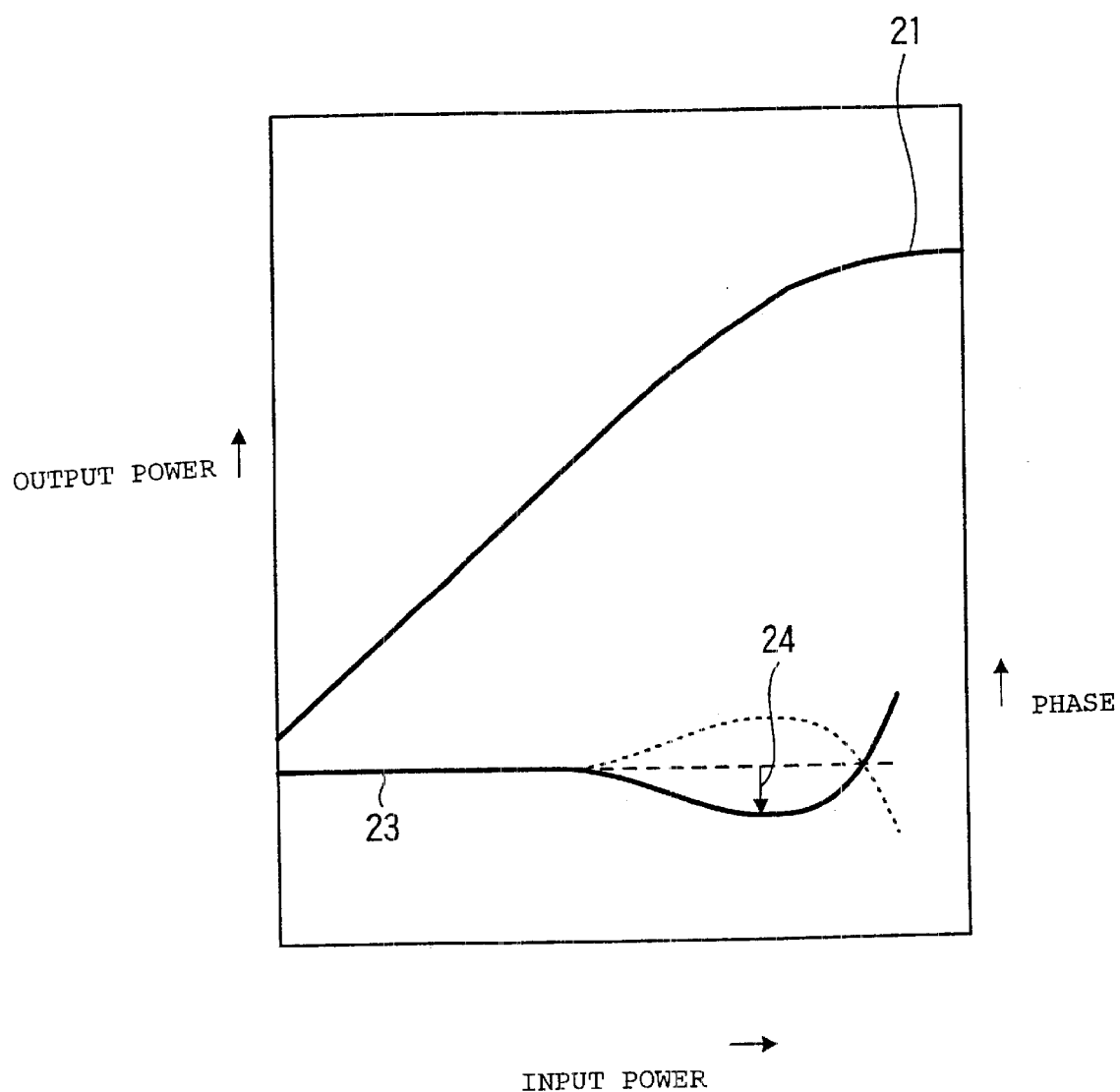
FIG. 5 is a characteristic diagram of AM/AM and amplitude/phase (AM/PM) of a power amplifying circuit.

Next, phase correction data to be stored in the phase-shift circuit 11 will be described. The phase correction data is very simple as compared to the amplitude correction. The amplitude/phase (AM/PM) characteristic 23 of the power amplifying circuit 12 shown in FIG. 5 is obtained by measurement and then the sign of a value of the phase shift 24 shown in FIG. 5 is inverted and then this is stored as the phase correction data.

Distortion generated in each power amplifying circuit 12 accommodated in the amplitude correction memory 3 and phase at correction memory 6 is killed by storage distortion component stored in the phase correction memory 6, which is inverted distortion.

Figure 2:
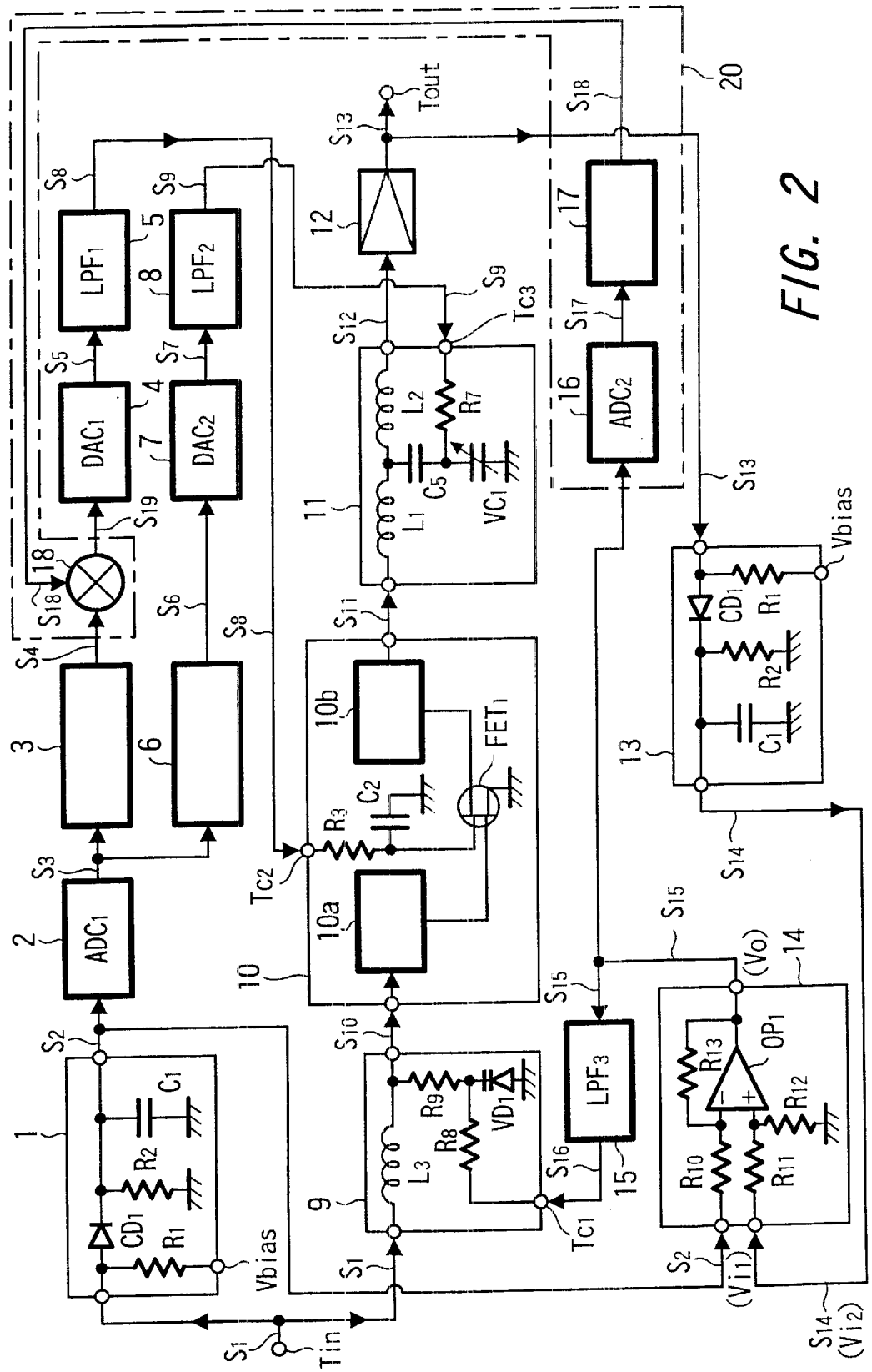
FIG. 2 is a block diagram showing another embodiment of the present invention.

Next, a second embodiment of the present invention will be described. FIG. 2 is a block diagram showing another embodiment of the present invention. In this embodiment, a circuit 20 indicated by a dot and dash line is added to the embodiment of FIG. 1. Therefore, this added portion will be described. First, the structure of the added circuit 20 will be described. This added circuit comprises the second $ADC_2$·16 which receives part of the differential output $S_{15}$ from the subtracting circuit 16 for digitalizing it as an input, a third memory 17 like RAM (random access memory) which employs the digital output $S_{17}$ of this second $ADC_2$·16 for outputting data $S_{18}$ corresponding to this address and a multiplying circuit 18 which receives this digital data $S_{18}$ as one input and is installed between the first amplitude correction memory 3 of the embodiment shown in FIG. 1 and the first $ADC_1$·4 for receiving the output $S_4$ of the first amplitude correction memory 3 as another input so as to digital-multiply data $S_{18}$ with $S_4$ and output an operation result $S_{19}$.

Next, an operation of this added circuit 20 will be described. The added circuit 20 is installed in order to correspond to changes of the characteristic such as temperature of the power amplifying circuit 12 for compensating distortion.

In the added circuit 20 of FIG. 2, the output $S_{15}$ of the subtracting circuit 14 is a differential of an envelope of input/output signal from the power amplifying circuit 12. If distortion in the power amplifying circuit 12 is corrected properly, this output $S_{15}$ of an differential signal becomes zero. However, if a change of the characteristic such as temperature occurs, this output $S_{15}$ of the differential signal indicates a certain value. By reading out data stored in the third memory 17 or correction data with this value as an address and then multiplying it by the amplitude correction data $S_4$, the change of the characteristic such as temperature is coped with.

Figure 6:
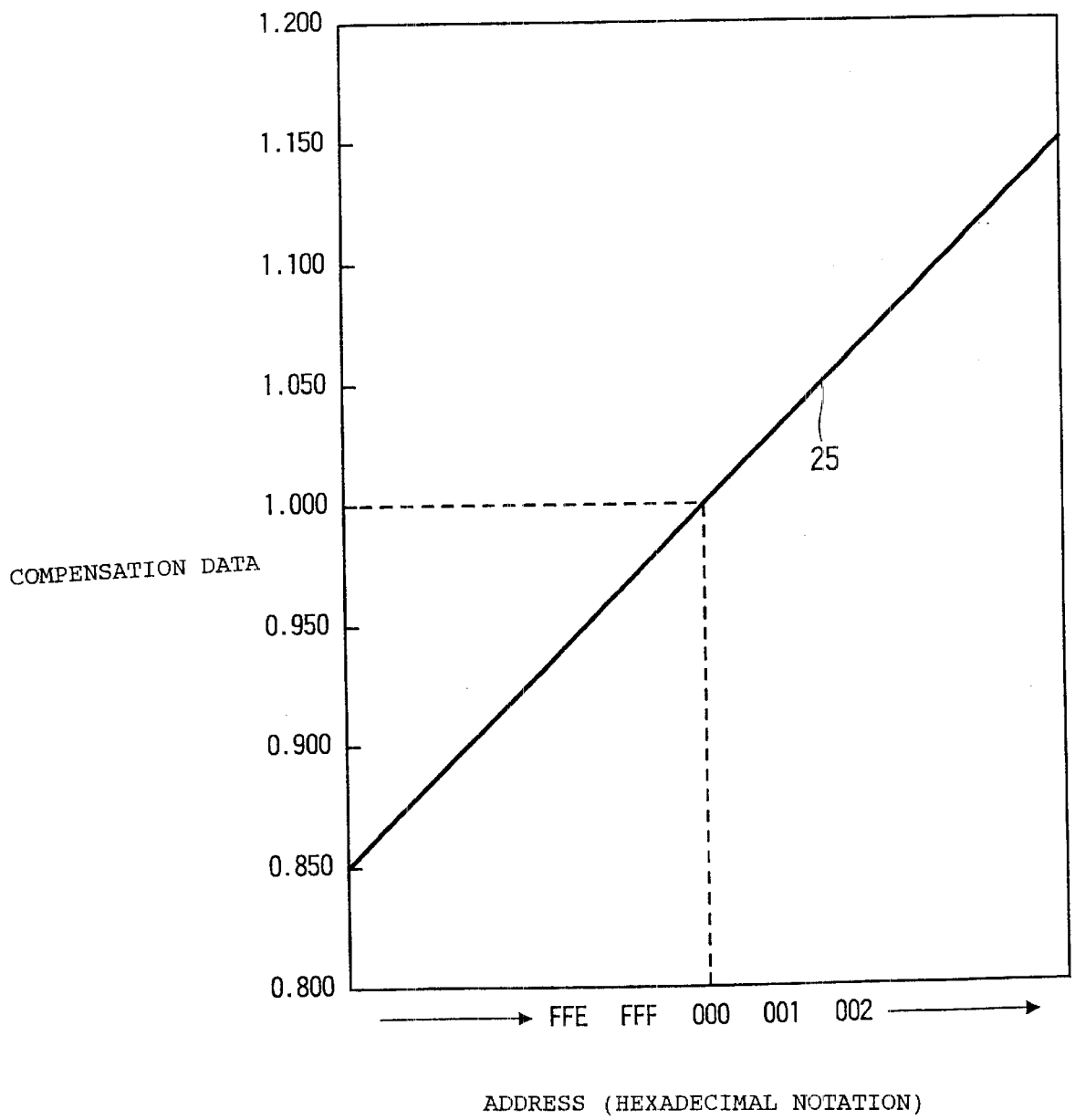
FIG. 6 is a characteristic diagram of feedback loop path used by the power amplifying circuit of the present invention and compensation data.

Next, the correction data 25 stored in this third memory 17 will be described. FIG. 6 shows an example of the correction data characteristic 25 which is relation between this correction data and address. The address value is expressed by signed hexadecimal number of the differential signal $S_{15}$ from the subtracting circuit 14 and if the output of the power amplifying circuit 12 is smaller than the input, this becomes positive. Otherwise, it becomes negative. That is, if the power amplifying circuit 12 is corrected properly in terms of distortion, $S_{15}$ turns out to be equal to 0, so that the correction data is always outputted in the form of 1.000. If the output of the power amplifying circuit 12 is smaller than the input, a correction data larger than 1.000 is outputted, so that it is multiplied by amplitude correction data $S_4$. Consequently, at a time of the input to the power amplifying circuit 12, the rate of predistortion is increased. If this adaptive correction is insufficient, the differential signal $S_{15}$ from the subtracting circuit 14 is increased, so that $S_4$ is multiplied by the more large correction $S_4$. As a result, the difference between the envelopes of the input and output of the power amplifying circuit 12 is minimized.

Figure 3:
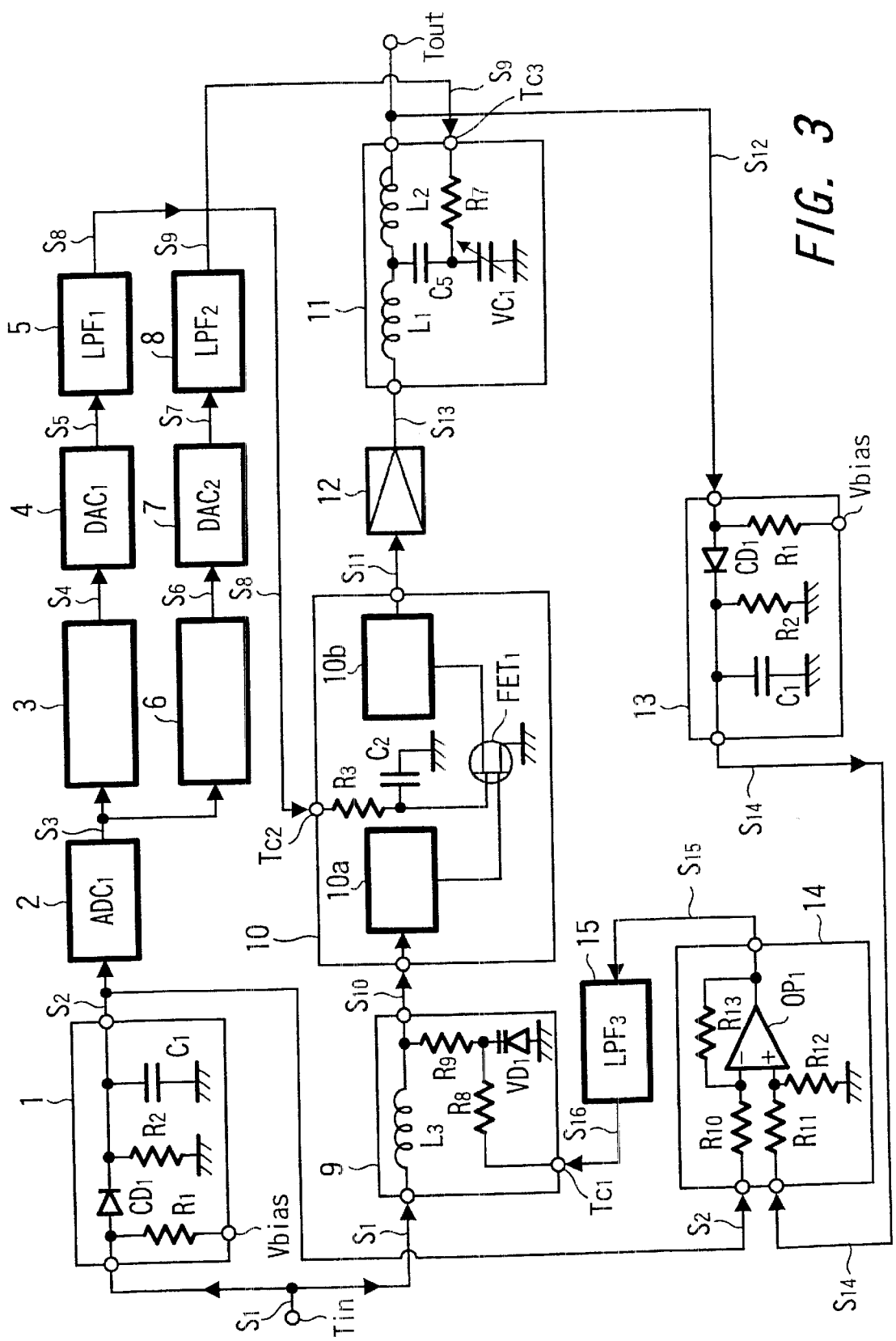
FIG. 3 is a block diagram showing still another embodiment of the present invention.

Next, a third embodiment of the present invention will be described with reference to FIG. 3. FIG. 3 is a block diagram showing further other embodiment of the present invention, and the constitution of FIG. 3 is the same as that of FIG. 1 other than the fact that the phase-shifting circuit 11 connected to the prestage of the power amplifying circuit 12 located in the main path is connected with the poststage of the power amplifying circuit 12 to the embodiment of FIG. 1, therefore the same reference letters is added to a corresponding part with FIG. 1 to omit overlapping description and describe only different constitution.

In FIG. 3, an output signal $S_{11}$ of the gain variable circuit 10 in the main path is supplied the input side of the power amplifying circuit 12 whose distortion should be compensated and then an output signal $S_{13}$ of the power amplifying circuit 12 is supplied the input side of the phase-shifting circuit 11, control signals from the first $LPF_1$·5 and the second $LPF_2$·8 are supplied to control terminals $T_{C2}$, $T_{C3}$ of the gain variable circuit 10 and the phase-shifting circuit 11 respectively, and the high frequency signal $S_{12}$ to be supplied to the second envelope detecting circuit 13 in order to form feedback loop is outputted from the phase-shifting circuit 11 and also supplied to the output terminal $T_{out}$.

There has been a problem that if the phase-shifting circuit 11 is provided at the prestage of the power amplifying circuit 12 as shown in FIG. 1, a little error in distortion compensation processing for the high frequency input signal $S_1$ greatly affects distortion compensation by amplification of the power amplifying circuit 12, thereby adjustment of the value of distortion compensation become difficult.

When the phase-shifting circuit 11 is moved to the post-stage of the power amplifying circuit 12 as shown in FIG. 3, since distortion of phase of the signal envelope going in the main path is compensated by means of the control signal $S_9$ for phase predistortion at the last stage, distortion of phase due to passage through the power amplifying circuit 12 may be compensated exactly. As described below, the phase-shifting circuit 11 may be composed of a capacitor, a resistor and a coil, if a little insertion loss is generated, a system having excellent efficiency is obtained since there is no insertion loss in the circuit 11 requiring supply of power. Therefore, in accordance with constitution of FIG. 3, the distortion compensating device having excellent effect of phase compensation may be realized with the same power efficiency and stability of the circuit as the system in FIG. 1. In addition, since compensation of phase distortion may be adjusted finely at the last stage, realization of highly efficient compensation of phase distortion become possible.

Figure 7:
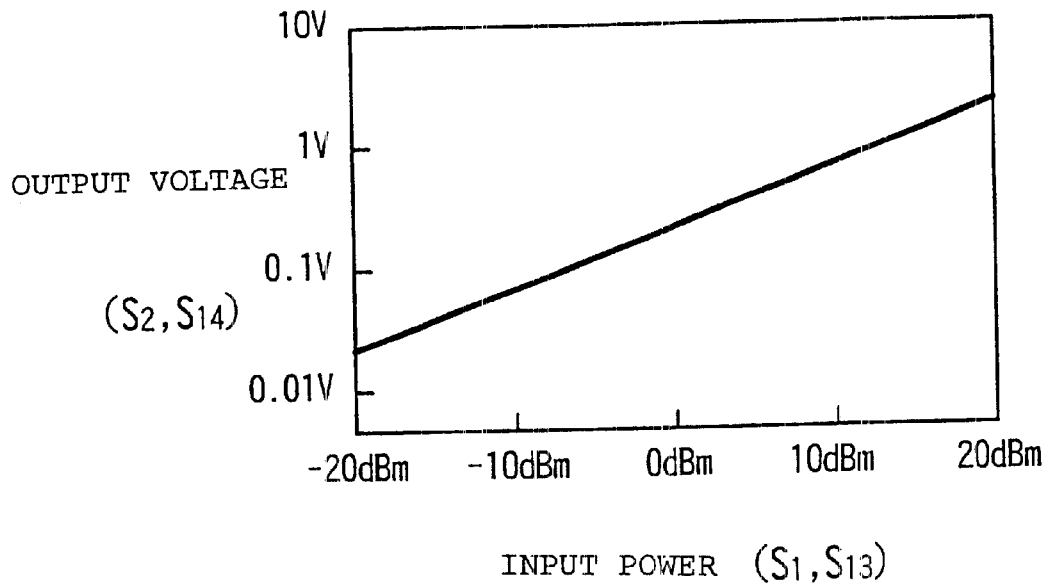
FIG. 7 is a detection characteristic diagram of an envelope detecting circuit for use in the present invention.

Next, an example of the respective components for use in carrying out the present invention will be described with reference to FIGS. 1 to 3. In an embodiment of the circuit which can be used as the first envelope detecting circuit 1 and the second envelope detecting circuit 13 shown in FIGS. 1 to 3, the anode terminal of a diode $CD_1$ serves for input while the cathode terminal thereof serves for output, and a resistor R2 and a capacitor $C_1$ are connected in parallel between this cathode terminal and ground. When the high frequency signal $S_1$ or the signal $S_{13}$ from the power amplifying circuit 12 is inputted to the input terminal Tin or the second envelope detecting circuit 13, only the envelope appears across the capacitor $C_1$. To improve non-linearity of a small signal portion of the diode $CD_1$, bias voltage Vbias is applied through a bias resistor $R_1$. FIG. 7 shows a characteristic diagram of an output signal $S_2$ or $S_{14}$ of an output voltage for the input signal $S_1$ or $S_{18}$ of the envelope voltage obtained in the envelope detecting circuit 1, 13 in FIGS. 1 to 3.

One embodiment of the gain variable circuit 10 of FIGS. 1 to 3 is an example using double gate FET. The double gate $FET_1$ has a circuit whose source is grounded. An input matching circuit 10a is connected to the first gate, so that the high-frequency signal $S_1$ as the delayed signal $S_{10}$ thorough the delay circuit 9 is inputted to the first gate of the double gate $FET_1$ through an input matching circuit 10a. An output matching circuit 10b is connected to the drain of the double gate $FET_1$ so that controlled high-frequency signal $S_{11}$ is outputted to the phase-shift circuit 11. A resistor $R_3$ and a capacitor $C_2$ are connected to the second gate of the double gate $FET_1$ and a control voltage Vc of an control signal $S_8$ is applied through the control terminal $Tc_2$. Consequently, its gain is controlled by using the fact that the mutual conductance of the double gate $FET_1$ depends on the control voltage Vc applied to the second gate.

Figure 8:
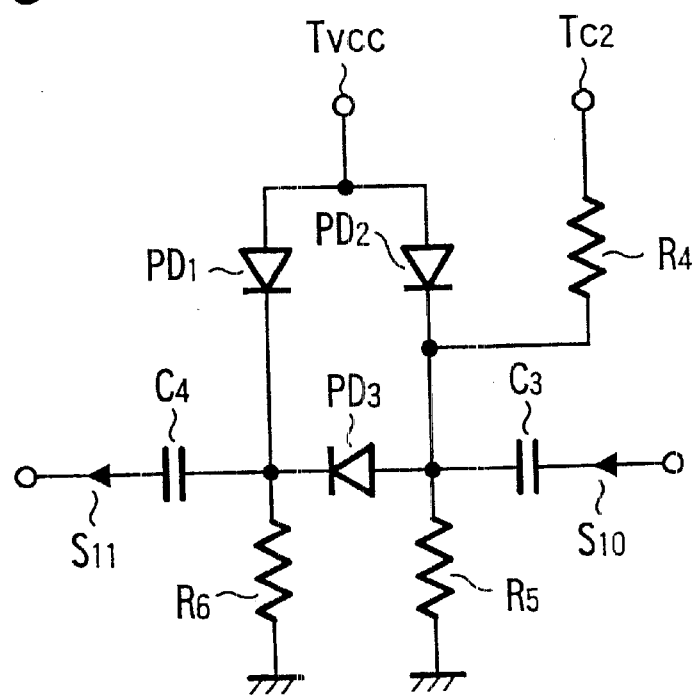
FIG. 8 is another circuit diagram of a gain variable circuit for use in the present invention.

FIG. 8 shows an embodiment having another circuit structure applicable to the gain variable circuit 10 of FIGS. 1 to 3. In this circuit structure, three PIN diodes, $PD_1$, $PD_2$, $PD_3$ are used. The PIN diodes, $PD_1$, $PD_2$, $PD_3$ have π type attenuation circuit, in which at voltage is applied from the terminal Tvcc and biased through the resistors $R_5$, $R_6$. Further, the control voltage Vc supplied to the control terminal $Tc_2$ is applied through the resistor $R_4$. The high-frequency $S_1$ is inputted from one terminal of the capacitor $C_3$ through the delay circuit 9 as the signal $S_{10}$ and outputted through the capacitor $C_4$ as the output signal $S_{11}$. The attenuation degree of the π type attenuation circuit comprising the three PIN diodes, $PD_1$, $PD_2$, $PD_3$ is controlled by the control voltage Vc.

According to one embodiment of the phase shift circuit 11 of FIGS. 1 to 3, the output signal $S_{11}$ from the gain variable circuit 10 is inputted so that the output signal $S_{12}$ is outputted through the inductances $L_1$ and $L_2$ connected in series. A capacitor $C_5$ and a variable capacity device $Vc_1$ such as a varicap diode are connected to a junction point between the inductances $L_1$ and $L_2$ in series and grounded. A connection point between the capacitor ($C_5$ and the variable capacity device $Vc_1$ are connected to a control terminal $Tc_3$ through a resistor $R_7$. Because the phase of the high-frequency signal $S_1$ passing between the input and output terminals of the phase-shift circuit 11 is shifted by the voltage of the signal $S_9$ applied to the control terminal $Tc_3$ from the phase correction memory 6, the AM/PM characteristic 23 of FIG. 5 is linearized.

Figure 9:
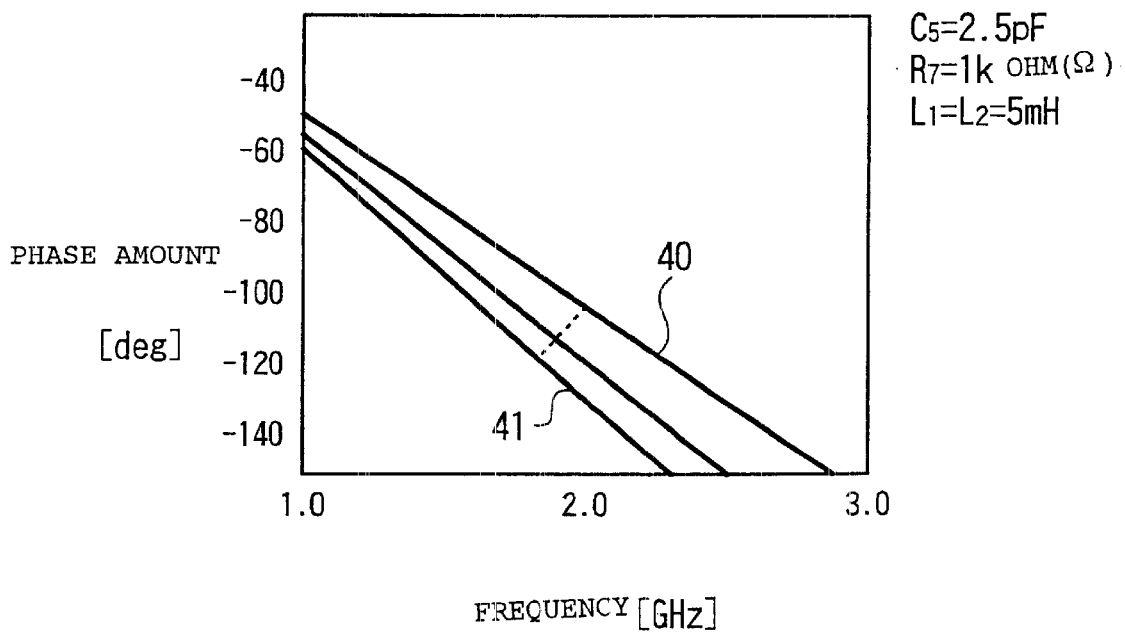
FIG. 9 is a shift characteristic diagram of a phase circuit for use in the present invention.

FIG. 9 shows an example of a characteristic diagram of the phase-shifting circuit 11. Examples of concrete constants of each device when this phase-shift characteristic is obtained. This constant differs depending on frequency, however, deviation is generated by 10° to 40° in the range of the control voltage of 0.5 V to 3.0 V from the characteristic curve 40 in which the voltage of the control signal $S_9$ to the terminal $T_{C3}$ of the phase-shifting circuit 11 is 0.5 V to the characteristic curve 41 in which the voltage of the control signal $S_9$ to the terminal $T_{C3}$ of the circuit 11 is 3 V.

According to an embodiment of the concrete circuit as the delay circuit 9 for use in FIGS. 1 to 3, the inductance $L_3$ composed of a coil is connected between the input and output terminals and by supplying the high-frequency signal $S_1$, a delay signal $S_{10}$ is outputted from the output terminal. A resistor $R_9$ and a variable capacity diode $VD_1$ such as a varactor diode are connected to the output terminal of the inductance $L_3$ in series and an end of the variable capacity diode $VD_1$ is grounded. An output control signal $S_{16}$ of the third $LPF_3$ is supplied to a connection point between the resistor $R_9$ and the variable capacity diode $VD_1$ from the control terminal $Tc_1$ through the resistor $R_8$.

In FIGS. 1 to 3, the subtracting circuit 14 is a well known subtractor using a differential amplifier $OP_1$. Assuming that the voltages of the signals $S_2$ and $S_{14}$ supplied to the two input terminals of $OP_1$ are $Vi_1$ and $Vi_2$, the output voltage $V_0$ of the output signal $S_{15}$ is as follows.

$$V0 = R_{12}/R_{11} \cdot Vi_2 - R_{13}/R_{10} \cdot Vi_1$$

If $V_{10} = V_{11} = V_{12} = V_{13}$, it comes that $V_0 = Vi_2 \cdot Vi_1$

Figure 10:
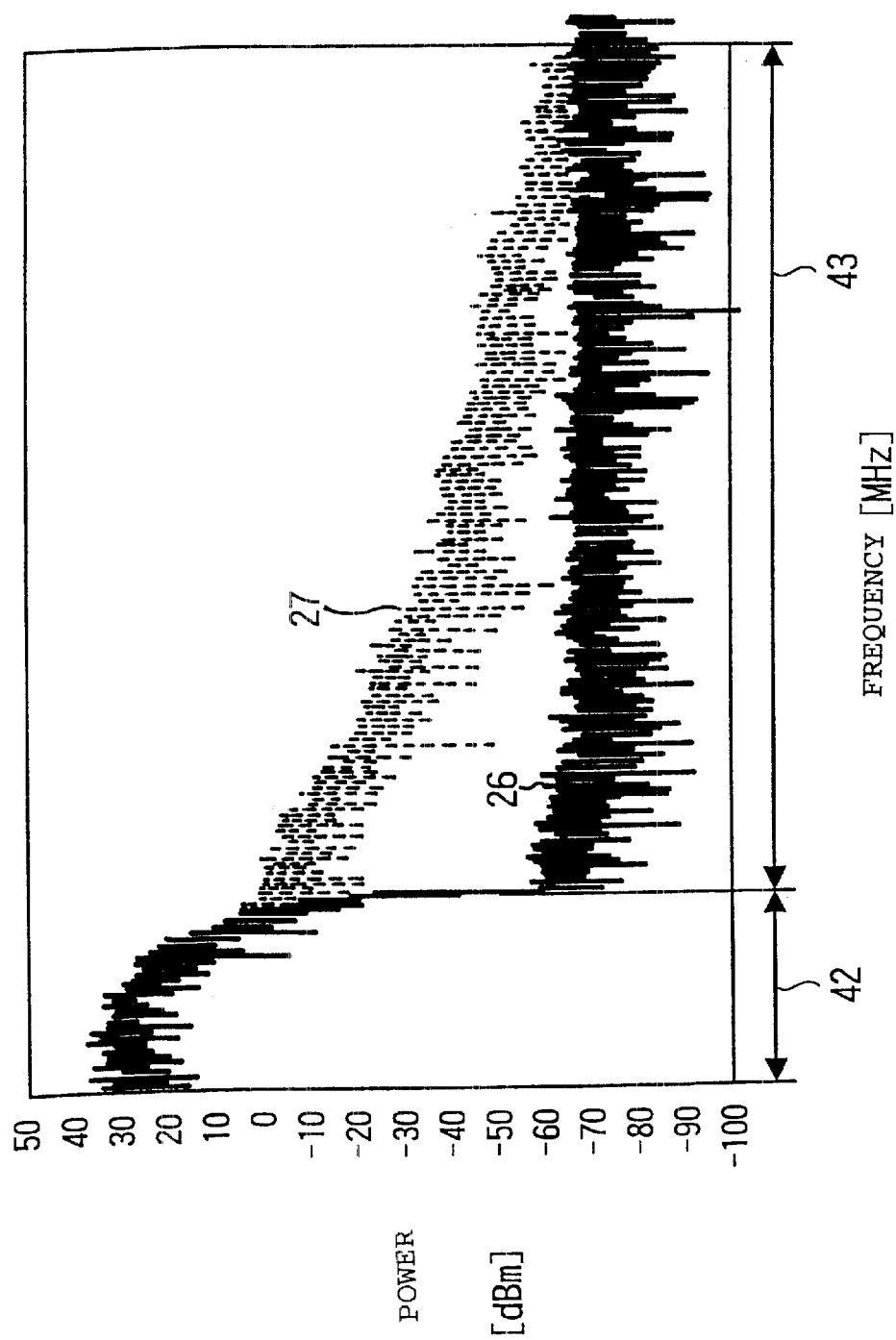
FIG. 10 is a spectrum characteristic comparison diagram for comparing the present invention with a conventional power amplifying circuit.
Figure 11:
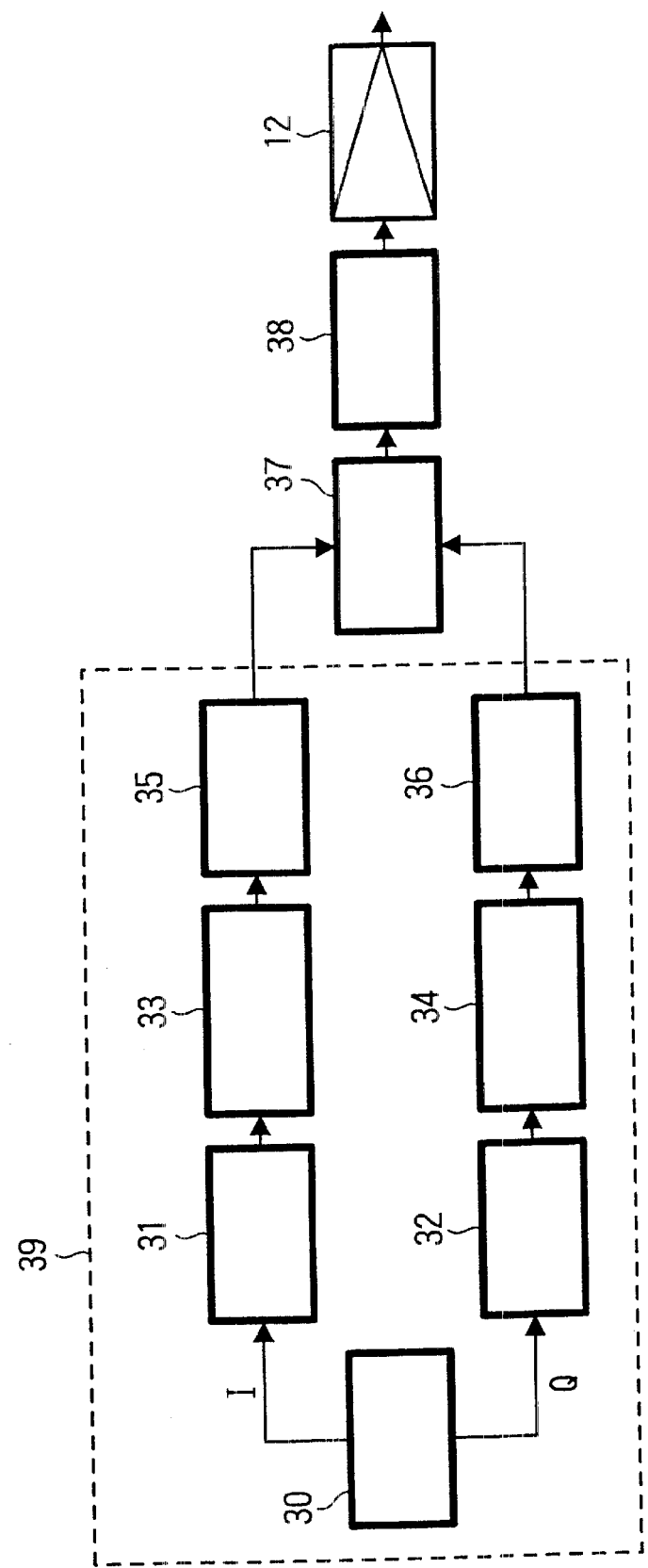
FIG. 11 is a block diagram of a distortion compensating device.

FIG. 10 shows the condition of distortion compensation effect of the distortion compensating device of the present invention. In FIG. 10, the kind of a signal indicated by a curve 27 is 1S-95 (CDMA-ONE) and code modulation is OQPSK. FIG. 9 shows the at condition of distortion generation when this signal is inputted to the power amplifying circuit 12 for compensating the distortion at 1.2288 Mcps. A curve 28 indicates that the embodiment of the present invention is applied to compensate the distortion under the same condition. The distortion is a spectrum near main lobe 42, which indicates improvement of about 50 dB and it is evident that in a frequency band near a side lobe 43, the distortion is almost completely compensated.

In addition, in each embodiment shown in FIGS. 1 to 3, the example in which the gain variable circuit 10 and the phase-shifting circuit 11 are provided in the main path, and the corrective control signal route including the amplitude correction memory 3, the corrective control signal route including the phase correction memory 6 and the feedback signal system are provided in the control system is explained, however, it is apparent that circuit constitution (see claim 1) provided with the gain variable circuit 10 in the main path and the corrective control signal route including the amplitude correction memory 3 in the control system and in which the feedback signal system is provided or not provided, circuit constitution (see claim 2) provided with the phase-shifting circuit 11 in the main path and the corrective control signal route including the phase correction memory 6 in the corrective control signal route and in which the feedback signal system is provided or not provided, and circuit constitution in which the phase-shifting circuit 11 is located at the poststage of the power amplifying circuit 12 whose distortion is compensated in the invention of claim 2 may be also preferable.

Since the distortion compensating device of the present invention is characterized in that part of an input of the power amplifying circuit whose distortion is intended to be compensated is picked up and its envelope component is detected and digitalized to apply predistortion to the high frequency signal, distortion compensation is carried out completely. Further, a means to be added to the base band portion is not required unlike the a conventional predistortion. Therefore, even if any filter is installed in a path from the base band to the power amplifying circuit, the effect of the distortion compensation is never affected. In addition, the device in which the phase-shifting circuit is located at the poststage of the power amplifying circuit, since phase distortion of signal envelope traveling in the main path is compensated at the last stage by the control signal $S_9$ in which phase predistortion is conducted, phase distortion due to passage through the power amplifying circuit may be compensated accurately. The phase-shifting circuit can be composed of the capacitor, the resistor and the coil, and a little insertion loss is generated, however, since it is not the control section requiring power supply, the system having excellent power efficiency is obtained, and the distortion compensating circuit holding the effect of phase distortion compensation is obtained. Further, because the compensation data stored in the memory depends on only AM/AM, AM/PM characteristics of the power amplifying circuit whose distortion is intended to be compensated, it is possible to obtain a route using the power amplifying circuit, which does not depend on, for example, PDC (Personal Digital Cellular), PHS (Personal Handy Phone Route), CDMA and the like.

That is, the distortion compensating device of the present invention has an extremely large advantageous effect that it carries out digital predistortion without connection of any signal with other than the peripheral of the power amplifying circuit and it does not depend on the mobile phone route.
Description of Reference Numerals
1 . . . ENVELOPE DETECTING CIRCUIT (DETECTING MEANS FOR ENVELOPE)
2, 16 . . . ANALOG-TO-DIGITAL CONVERTER ($ADC_1$, $ADC_2$)
3 . . . AMPLITUDE CORRECTION MEMORY (AMPLITUDE CORRECTION MEMORY MEANS)
4, 7 . . . DIGITAL-TO-ANALOG CONVERTER ($DAC_1$, $DAC_2$)
5, 8, 15 . . . LOW PASS FILTER ($LPF_1$, $LPF_2$, $LPF_3$)
6 . . . PHASE CORRECTION MEMORY (PHASE CORRECTION MEMORY MEANS)
9 . . . DELAY CIRCUIT (DELAY MEANS)
10 . . . GAIN VARIABLE CIRCUIT (GAIN VARIABLE MEANS)
10A, 10B . . . MATCHING CIRCUIT
11 . . . PHASE-SHIFTING CIRCUIT (PHASE-SHIFTING MEANS)
12 . . . POWER AMPLIFYING CIRCUIT (POWER AMPLIFYING MEANS)
14 . . . SUBTRACTING CIRCUIT
17 . . . THIRD MEMORY (RAM)
18 . . . MULTIPLYING CIRCUIT
20 . . . ADDED CIRCUIT
21 . . . AMPLITUDE CHARACTERISTIC CURVE
22 . . . IDEALIZED AMPLITUDE-CHARACTERISTIC CURVE
23 . . . AM/PM CHARACTERISTIC CURVE
24 . . . PHASE DEVIATION CHARACTERISTIC CURVE
25 . . . COMPENSATION DATA CHARACTERISTIC CURVE
26 . . . DISTORTION CHARACTERISTIC CURVE IN THE MAIN LOBE AND THE SIDE LOBE
27 . . . DISTORTION CHARACTERISTIC CURVE OF THE PRESENT INVENTION IN THE MAIN LOBE AND THE SIDE LOBE
30 . . . SIGNAL PROCESSING PORTION
31 . . . I-SIGNAL ADC
32 . . . Q-SIGNAL ADC
33 . . . I-SIGNAL PREDISTORTER
34 . . . Q-SIGNAL PREDISTORTER
35 . . . I-SIGNAL DAC
36 . . . Q-SIGNAL DAC
37 . . . ORTHOGONAL MODULATOR
38 . . . UP-CONVERTER
39 . . . BASE BAND PORTION
40 . . . VOLTAGE OF THE CONTROL SIGNAL $S_9$ TO THE TERMINAL $T_{C3}$ OF THE PHASE-SHIFTING CIRCUIT 11=0.5 V
41 . . . VOLTAGE OF THE CONTROL SIGNAL $S_9$ TO THE TERMINAL $T_{C3}$ OF THE PHASE-SHIFTING CIRCUIT 11=3 V
42 . . . MAIN LOBE BAND
43 . . . SIDE LOBE BAND

What is claimed is:
1. A distortion compensating device for performing predistortion on power amplifying means whose distortion is to be compensated, comprising:
envelope detecting means to which a high-frequency signal generating an envelope change is supplied for detecting an envelope of said high-frequency signal and producing an envelope signal;
amplitude correction memory means for storing an inverted distortion amplitude value of a distortion generated in said power amplifying means with digital data obtained by digitalizing said envelope signal from said envelope detecting means as an address;
gain variable means disposed in a prestage of said power amplifying means to which said high-frequency signal generating said envelope change is supplied for controlling a passage gain of said high-frequency signal passed therethrough, wherein
said inverted distortion data of said amplitude correction memory means are converted to analog data and supplied to said gain variable means so as to compensate for amplitude distortion of said power amplifying means;
phase correction memory means located in parallel with said amplitude correction memory means and that stores an inverted distortion phase value of distortion to be generated in said power amplifying means, with digital data obtained by digitalizing said envelope signal from said envelope detecting means as an address; and phase-shifting means that controls a passage phase of said high frequency signal by supplying analog data that said inverted distortion data of said phase correction memory means are converted into analog data, wherein said phase-shifting means is connected with said gain variable means in series at said prestage of said power amplifying means, wherein delay means for adjusting a difference of delay time between a main path having said power amplifying means and said gain variable means and a corrective control signal route having said envelope detecting means for supplying a control signal to said gain variable means and said amplitude correction memory means is provided in said main path, and wherein by detecting an envelope signal from an output stage of said power amplifying means and feeding back a differential signal obtained by comparing said detected signal with an envelope signal output from said envelope detecting means to said delay means said delay time is controlled.

2. A distortion compensating device for performing predistortion on power amplifying means whose distortion is to be compensated, comprising:

envelope detecting means to which a high-frequency signal generating an envelope change is supplied for detecting an envelope of said high-frequency signal and producing an envelope signal;

amplitude correction memory means for storing an inverted distortion amplitude value of a distortion generated in said power amplifying means with digital data obtained by digitalizing said envelope signal from said envelope detecting means as an address;

gain variable means disposed in a prestage of said power amplifying means to which said high-frequency signal generating said envelope change is supplied for controlling a passage gain of said high-frequency signal passed therethrough, wherein said inverted distortion data of said amplitude correction memory means are converted to analog data and supplied to said gain variable means so as to compensate for amplitude distortion of said power amplifying means;

phase correction memory means located in parallel with said amplitude correction memory means and that stores an inverted distortion phase value of distortion to be generated in said power amplifying means, with digital data obtained by digitalizing said envelope signal from said envelope detecting means as an address; and phase-shifting means that controls a passage phase of said high frequency signal by supplying analog data that said inverted distortion data of said phase correction memory means are converted into analog data, wherein said phase-shifting means is connected with said gain variable means in series at said prestage of said power amplifying means, and wherein an output obtained by comparing an envelope-detected output of said power amplifying means with the envelope signal of said envelope detecting means is digitalized and correction data memory means for storing correction data for correcting a characteristic change by temperature with said digital data as an address is driven to multiply an output of said correction data memory means by said output of said amplitude correction memory means thereby compensating a change of a temperature characteristic of said power amplifying means.

3. A distortion compensating device, comprising:

first envelope detecting means for detecting an envelope with a part of a high frequency signal having fluctuation of envelope as an input and producing an envelope signal;

digital-to-analog converting means for converting said envelope signal of said first envelope detecting means into digital data;

amplitude correction memory means in which the digital data are inputted as an address and that outputs amplitude correction data corresponding to said address by means of data stored for amplitude correction in advance;

multiplying means in which digital multiplier is a product with a digital output of said amplitude correction memory means as multiplicand;

first low pass filtering means for converting digital data from said multiplying means to an analog signal to eliminate digital noise of said analog signal;

phase correction memory means in which said digital data are inputted as an address and that outputs phase correction data corresponding to said address by means of data stored for phase correction in advance;

second low pass filtering means for converting said phase correction data into a second analog signal to eliminate digital noise of said analog signal;

delay means that adjust a volume of delay of passing time by means of a control signal to be added into a control terminal with said high frequency signal as an input;

gain variable means for varying a passage gain depending on a voltage of said signal from said first low pass filtering means to be added into a control terminal with a delay signal of said delay means as an input;

phase-shifting means for varying a passage phase by an output signal from said second low pass filtering means with an output of said gain variable means as an input to input a variable output signal into a power amplifying means whose distortion is to be corrected;

second envelope detecting means for detecting an envelope of an output of said power amplifying means whose distortion is to be corrected and for producing a second envelope signal;

subtracting means for detecting a difference between envelope signals with envelope signals of said first and second envelope detecting means as inputs;

third low pass filtering means for detecting only a DC signal of said subtracting means to feed said DC signal back to said control terminal of said delay means; and correction data memory means for outputting data corresponded to said address that corrects a change of characteristic due to temperature with output of digital data in which an output difference signal of said subtracting means is digitalized as an address, wherein data corresponding to said address from said correction data memory means are supplied as a multiplier of said multiplying means.

4. A distortion compensating device for performing predistortion on power amplifying means whose distortion is to be compensated, comprising:

- envelope detecting means to which a high-frequency signal generating an envelope change is supplied for detecting an envelope of the high-frequency signal and producing an envelope signal;
- phase correction memory means for storing an inverted distortion phase value of a distortion generated in said power amplifying means with digital data obtained by digitalizing said envelope signal from said envelope detecting means as an address; and
- phase-shifting means disposed in a prestage of said power amplifying means to which said high-frequency signal generating said envelope change is supplied for controlling a passage phase of said high-frequency signal passed therethrough, wherein
    - said inverted distortion data of said phase correction memory means are converted to analog data and supplied to said phase-shifting means so as to compensate for phase distortion of said power amplifying means, wherein
- delay means for adjusting a difference of delay time between a main path having said power amplifying means and said phase-shifting means and a corrective control signal route having said envelope detecting means for supplying a control signal to said phase-shifting means and said phase correction memory means is provided in said main path, and wherein
    - delay means for adjusting a difference of delay time between a main path having said power amplifying means and said phase-shifting means and a corrective control signal route having said envelope detecting means for supplying a control signal to said phase-shifting means and said phase correction memory means is provided in said main path.

* * * * *